United States Patent
Wanninger

(10) Patent No.: US 7,959,328 B2
(45) Date of Patent: Jun. 14, 2011

(54) LATERALLY EMITTING, RADIATION-GENERATING COMPONENT AND LENS FOR ONE SUCH COMPONENT

(75) Inventor: Mario Wanninger, Harting (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 617 days.

(21) Appl. No.: 11/662,215

(22) PCT Filed: Jul. 22, 2005

(86) PCT No.: PCT/DE2005/001292
§ 371 (c)(1),
(2), (4) Date: Mar. 20, 2008

(87) PCT Pub. No.: WO2006/026939
PCT Pub. Date: Mar. 16, 2006

(65) Prior Publication Data
US 2008/0192479 A1  Aug. 14, 2008

Related U.S. Application Data

(60) Provisional application No. 60/607,904, filed on Sep. 8, 2004.

(30) Foreign Application Priority Data

Sep. 8, 2004  (DE) .......................... 10 2004 043 516

(51) Int. Cl.
*F21V 7/00* (2006.01)
(52) U.S. Cl. .......... 362/309; 362/327; 362/335; 359/728
(58) Field of Classification Search .......... 359/726–728; 362/308–310, 327, 329, 335
See application file for complete search history.

(56) References Cited

U.S. PATENT DOCUMENTS

| 4,638,343 | A | 1/1987 | Althaus et al. |
| 5,608,290 | A * | 3/1997 | Hutchisson et al. .......... 362/327 |
| 6,449,086 | B1 | 9/2002 | Singh |
| 6,598,998 | B2 | 7/2003 | West et al. |

(Continued)

FOREIGN PATENT DOCUMENTS

DE          850 013          9/1952

(Continued)

*Primary Examiner* — Stephen F Husar
(74) *Attorney, Agent, or Firm* — Cohen Pontani Lieberman & Pavane LLP

(57) ABSTRACT

A laterally emitting radiation-generating component comprising a radiation source, the optical axis of which runs perpendicular to a mounting area of the component, and comprising an optical device arranged downstream of the radiation source. The optical device includes a reflective surface shaped like a V in cross section and a refractive surface that is shaped convexly as seen externally and is arranged between the reflective surface and a bottom area facing the radiation source. The bottom area is arranged and formed in such a way that through it electromagnetic radiation from the radiation source couples into the optical device. The reflective surface is arranged and formed in such a way that a central first portion of the coupled-in radiation is deflected toward the refractive surface by the reflective surface. The refractive surface is arranged and formed in such a way that both a radiation coming from the reflective surface and a radiation coming directly from the radiation source are coupled out through it with simultaneous beam focusing laterally with respect to the optical axis of the radiation source.

4 Claims, 1 Drawing Sheet

U.S. PATENT DOCUMENTS

| | | |
|---|---|---|
| 6,607,286 B2 | 8/2003 | West et al. |
| 6,679,621 B2 | 1/2004 | West et al. |
| 6,724,462 B1 | 4/2004 | Singh et al. |
| 2004/0075100 A1 | 4/2004 | Bogner et al. |

FOREIGN PATENT DOCUMENTS

| | | |
|---|---|---|
| DE | 4407911 | 9/1995 |
| EP | 1 453 107 A | 9/2004 |
| GB | 2 340 301 A | 2/2000 |
| JP | 51-24866 | 2/1976 |
| JP | 59-95651 | 6/1984 |
| JP | 61-127186 | 6/1986 |
| JP | 08-222758 | 8/1996 |
| JP | 10-150222 | 6/1998 |
| TW | 561279 | 11/2003 |
| WO | WO 88/03658 A | 5/1988 |
| WO | WO 02/084749 A2 | 10/2002 |

* cited by examiner

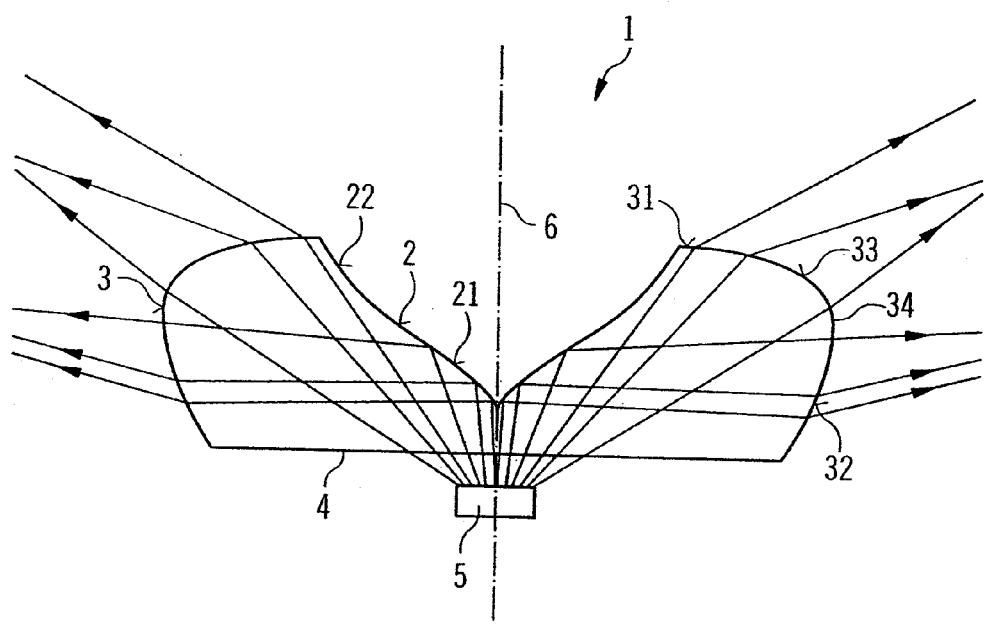

(12)  US 7,959,328 B2

LATERALLY EMITTING, RADIATION-GENERATING COMPONENT AND LENS FOR ONE SUCH COMPONENT

RELATED APPLICATIONS

This is a U.S. national stage of application No. PCT/DE2005/001292, filed on Jul. 22, 2005.

This patent application claims the priorities of the German patent application DE 102004043516.2 of Sep. 8, 2004 and of the U.S. patent application 60/607,904 of Sep. 8, 2004, the disclosure content of which is hereby explicitly incorporated by reference in the present patent application.

FIELD OF THE INVENTION

The invention relates to a laterally emitting radiation-generating component comprising a radiation source, the optical axis of which runs perpendicular to a mounting area of the component, and comprising an optical device arranged downstream of the radiation source, which optical device deflects an electromagnetic radiation from the radiation source that is coupled into it toward the side. It furthermore relates to a separately produced lens for such a component.

BACKGROUND OF THE INVENTION

In the present case, mounting area is that outer surface of the component which, in the state of the component mounted on a carrier, for example on an electrical printed circuit board, faces the carrier.

Such components and correspondingly configured lenses are disclosed for example in the documents U.S. Pat. No. 6,679,621 B2, U.S. Pat. No. 6,607,286 B2 and U.S. Pat. No. 6,598,998 B2. The components and lenses described therein firstly have a comparatively large structural height and secondly can only be produced using technically complicated means.

SUMMARY OF THE INVENTION

It is an object of the present invention to provide a component of the type mentioned above in the introduction which has a smallest possible structural height and which can be produced with a lower expenditure of effort and/or expense.

This and other objects are attained in accordance with one aspect of the present invention directed to a component of the type mentioned in the introduction in which the optical device has a reflective surface shaped like a V in cross section and a refractive surface that encloses the reflective surface and is shaped convexly as seen externally, i.e. as seen from the outside, the refractive surface being arranged between the reflective surface and a bottom area facing the radiation source. In this case, the bottom area is arranged and formed in such a way that through it electromagnetic radiation from the radiation source couples into the optical device, and the reflective surface is arranged and formed in such a way that a central first portion of a coupled-in radiation cone is deflected toward the refractive surface by said reflective surface. Finally, the refractive surface is arranged and formed in such a way that both a radiation coming from the reflective surface and a radiation coming directly from the radiation source are coupled out through it. Beam focusing laterally with respect to the optical axis of the radiation source is also accomplished by the refractive surface.

According to an embodiment of the invention, the convexly curved refractive surface "processes" both light bundles, that is to say both the one which originates from the reflective surface and the one which originates from the radiation source directly, that is to say without intervening targeted deflection at a surface of the optical device. The regions where the two light bundles impinge on the convex refractive surface are separated from one another in centroid terms. The light bundle deflected by the reflective surface impinges on a region of the refractive surface that is adjacent to the bottom area, and is refracted and focused by said region. The light bundle that originates directly from the radiation source impinges on a region of the refractive surface that is adjacent to the reflective surface, and is refracted and focused by said region.

The region adjacent to the bottom area and the region of the convex refractive surface that is adjacent to the reflective surface each have, in section, a curvature with a comparatively large radius of curvature and the transition region between these two regions has a small radius of curvature in comparison therewith.

In an advantageous configuration of the component and respectively of the lens, a surface region of the optical device and lens, respectively, that is shaded with respect to the radiation source is situated in the transition region between the reflective surface and the refractive surface. Particularly preferably, the shaded region is essentially a region of the reflective surface in the transition region to the refractive surface. The shaded region may be embodied as a separate area edged off from the adjacent surfaces (reflective surface and refractive surface), or with a smooth transition as part of one of the two adjacent surfaces. The shading advantageously enables back reflections to be reduced.

The optical device/lens according to an embodiment of the invention is, in terms of its form, approximately a refractive convex lens tilted outward at an angle >0° with respect to the optical axis of the radiation source with a refractive rear side by which radiation of the radiation source which is not directed directly onto the refractive surface of the lens after entry through the bottom area is deflected toward the side onto the refractive surface and is coupled out there with simultaneous focusing. A first refractive lens region is provided for this.

A radiation that impinges directly from the radiation source on a second refractive lens region separate from the first lens region is deflected directly toward the side of the component with simultaneous focusing by said second refractive lens region. The refractive surface may be formed in symmetrical or asymmetrical fashion. It may be formed as a free-form lens.

In order to produce the lens by means of injection molding or transfer molding, it is advantageously possible to use a technically simple mold which, in particular, does not require a technically complicated slide.

The lens can be produced separately and placed as an add-on optical element onto a component housing, with or without refractive index matching. However, it can also be cast directly onto a light emitting diode chip, for example. The bottom area is then not a real surface but only an imaginary area.

The component according to the invention can advantageously be used for the lateral emission of radiation of a top emitter, for the lateral coupling in of radiation of a top emitter into an optical waveguide, for the large-area backlighting of displays and symbols and of LCD displays, for signal luminaries, for homogeneous illumination of reflectors and for ambient illumination. The optical device according to the invention can also be integrated into optical waveguides in an adapted form.

BRIEF DESCRIPTION OF THE ONLY DRAWING

The FIGURE shows a schematic sectional view through an exemplary embodiment of a lens for a component according to the invention.

DETAILED DESCRIPTION OF THE ONLY DRAWING

The lens 1 in accordance with the exemplary embodiment has a rotationally symmetrical form with a reflective surface 2 shaped like a funnel into the lens from the front side of said lens, and a refractive surface 3 shaped convexly as seen externally, which refractive surface runs between the reflective surface 2 and a bottom area 4 of the lens and connects these to one another. The bottom area 4 is arranged and formed in such a way that through it electromagnetic radiation from a radiation source 5, for example an LED component, arranged behind the bottom area 4 as seen from the interior of the lens couples into the lens 1.

The reflective surface 2 is arranged and formed in such a way that a central first portion of the coupled-in radiation is deflected by said surface toward a first lens region 32 of the refractive surface 3, said first lens region being adjacent to the bottom area 4. The refractive surface 3 is arranged and formed convexly in such a way that both a radiation coming from the reflective surface 2 and a radiation that comes directly from the radiation source 5 and impinges on a second lens region 33 of the refractive surface 3, said second lens region being adjacent to the reflective surface 2, is coupled out laterally with respect to the optical axis 6 of the radiation source 5 through said refractive surface which also performs a beam focusing function. The first lens region 32 and the second lens region 33 are curved comparatively weakly in sectional view; the transition region 34 that connects these two lens regions 32, 33 is curved greatly by comparison therewith.

The reflective surface 2 shaped like a V is curved like an S in such a way that a first partial region 21 that is adjacent to the optical axis 6 is curved convexly as seen externally and a second partial region 22 that is adjacent to the refractive surface 3 is curved concavely as seen externally in such a way that a front-side edge region 31 of the refractive surface 3 is shaded from direct radiation from the radiation source 5. The convex part of the reflective surface 2 already effects a first focusing of a radiation from the radiation source that impinges on it.

Some exemplary values and ratios for the regions 21, 22, 32, 33 and 34 are presented below.

| Radius of curvature | Second lens region 33 | Transition region 34 | First lens region 32 |
|---|---|---|---|
| preferred value [mm] | 20 | 0.9 | 16 |
| minimal value [mm] | 10 | 0.4 | 3.5 |
| maximal value [mm] | 50 | 3.2 | 25 |
| Ratios: | | | |
| 33 to 34 | | 22/2 (preferred) | |
| | | 125/0 (max) | |
| | | 3/1 (min) | |
| 32 to 34 | | 17/8 (preferred) | |
| | | 62/5 (max) | |
| | | 1/1 (min) | |

| Radius of curvature | First partial region 21 | Second partial region 22 |
|---|---|---|
| preferred value [mm] | 8.2 | 7 |
| minimal value [mm] | 6 | 5 |
| maximal value [mm] | 10 | 20 |
| Ratios: | | |
| 21 to 22 | | 1/2 (preferred) |
| | | 2/0 (max) |
| | | 0/3 (min) |

It should be noted that the lens is scalable in size and, therefore, the ratios of the lens regions are particularly important.

Such a lens in accordance with the exemplary embodiment can be produced separately and placed for example onto a separately produced surface-mountable toplooker LED component. This may be effected for example by means of an adhesive whose refractive index preferably lies between the refractive index of a chip encapsulation material and that of the lens material. Furthermore, alignment elements for aligned emplacement of the lens may be provided at the lens and at the component housing.

A suitable exemplary embodiment of a toplooker LED component onto which the lens in accordance with the exemplary embodiment can be placed is described in WO 02/84749 A2, for example, the disclosure content of which is in this respect is hereby incorporated herein by reference.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. A laterally emitting radiation-generating component comprising:
   a radiation source, the optical axis of which runs perpendicular to a mounting area of the component; and
   an optical device arranged downstream of the radiation source,
   wherein the optical device includes a reflective surface shaped like a V in cross section and a refractive surface that is shaped convexly as seen externally and is arranged between the reflective surface and a bottom area facing the radiation source,
   wherein the bottom area is arranged and formed in such a way that through it electromagnetic radiation from the radiation source couples into the optical device,
   wherein the reflective surface is arranged and formed in such a way that a central first portion of the coupled-in radiation is deflected toward the refractive surface by said reflective surface,
   wherein the refractive surface is arranged and formed in such a way that both a radiation coming from the reflective surface and a radiation coming directly from the radiation source are coupled out through it with simultaneous beam focusing laterally with respect to the optical axis of the radiation source; and
   wherein at least a portion of the reflective surface shaped like a V is curved like an S in such a way that a part that is adjacent to the optical axis is curved concavely from the point of view of the radiation source and a part that is adjacent to the refractive surface is curved convexly from the point of view of the radiation source, so that a front-side edge region of the refractive surface is shaded from direct radiation from the radiation source.

2. The component as claimed in claim 1, in which the optical device is formed such that it is rotationally symmetrical about the optical axis of the radiation source.

3. A lens for a laterally emitting radiation-generating component comprising a radiation source, the optical axis of which runs perpendicular to a mounting area of the component, wherein the lens comprises:

a reflective surface shaped like a V in cross section; and a refractive surface that is shaped convexly as seen externally and is arranged between the reflective surface and a bottom area of the lens, wherein the bottom area is arranged and formed in such a way that through it electromagnetic radiation from the radiation source couples into the lens, wherein the reflective surface is arranged and formed in such a way that a central first portion of the coupled-in radiation is deflected toward the refractive surface by said reflective surface, wherein the refractive surface is arranged and formed in such a way that both a radiation coming from the reflective surface and a radiation coming directly from the radiation source are coupled out through it with simultaneous beam focusing laterally with respect to the optical axis of the radiation source; and wherein at least a portion of the reflective surface shaped like a V is curved like an S in such a way that a part that is adjacent to the optical axis is curved convexly as seen externally and a part that is adjacent to the refractive surface is curved concavely as seen externally, so that a front-side edge region of the refractive surface is shaded from direct radiation from the radiation source.

4. The lens as claimed in claim 3, which is formed such that it is rotationally symmetrical about the optical axis of the radiation source provided.

* * * * *